(12) United States Patent
Shin et al.

(10) Patent No.: US 6,848,169 B2
(45) Date of Patent: Feb. 1, 2005

(54) MAGNETIC TUNNELING JUNCTION AND FABRICATION METHOD THEREOF

(75) Inventors: Kyung-Ho Shin, Seoul (KR); Woo-Young Lee, Seoul (KR); Young-Joon Park, Seoul (KR); Kyung-Il Lee, Yongin (KR); Jae-Geun Ha, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 46 days.

(21) Appl. No.: 10/145,167

(22) Filed: May 13, 2002

(65) Prior Publication Data

US 2002/0185196 A1 Dec. 12, 2002

(30) Foreign Application Priority Data

May 15, 2001 (KR) ........................ 2001-26486

(51) Int. Cl.[7] .................. H01F 1/00; H01F 10/32; G11B 5/127
(52) U.S. Cl. .................. 29/603.14; 365/158; 365/171; 365/173; 148/121
(58) Field of Search .................. 365/171, 158, 365/173; 29/603.14; 148/121

(56) References Cited

U.S. PATENT DOCUMENTS

| | | | | |
|---|---|---|---|---|
| 6,359,289 B1 | * | 3/2002 | Parkin | 257/43 |
| 6,518,588 B1 | * | 2/2003 | Parkin et al. | 257/3 |
| 2002/0081753 A1 | * | 6/2002 | Gates et al. | 438/3 |
| 2002/0131215 A1 | * | 9/2002 | Beach | 360/324.2 |
| 2003/0067802 A1 | * | 4/2003 | Anthony et al. | 365/173 |
| 2003/0184919 A1 | * | 10/2003 | Lin et al. | 360/314 |

OTHER PUBLICATIONS

K.I. Lee, et al. (2002) "Enhanced Tunneling Magnetoreistance and Thermal Stability of Magnetic Tunnel Junction by Rapid Thermal Anneal", Journal of Magnetism and Magnetic Materials, pp. 120–122, 2002.

* cited by examiner

Primary Examiner—John P Sheehan
(74) Attorney, Agent, or Firm—Scully, Scott, Murphy & Presser

(57) ABSTRACT

A fabrication method of a magnetic tunnel junction includes the steps of: forming a magnetic tunnel junction constructed having a first magnetic layer, a tunnel barrier formed at an upper surface of the first magnetic layer and a second magnetic layer formed at an upper surface of the tunnel barrier; and thermally treating the junction rapidly for 5 seconds~10 minutes at a temperature of 200~600° C. to re-distribute oxygens in the tunnel barrier and make the interface between the tunnel barrier and the magnetic layer to be even. The tunneling magnetoresistance and thermal stability of the magnetic tunnel junction can be improved through the rapid thermal annealing.

11 Claims, 9 Drawing Sheets

+ : Defects
▓ : Over-oxidized CoFe layer

MAGNETIC TUNNELING JUNCTION AND FABRICATION METHOD THEREOF

BACKGROUND OF THE INVENTION

1. Field of the Invention

The present invention relates to a magnetic tunneling junction and its fabrication method, and more particularly, to a magnetic tunneling junction with improved electro-magnetic characteristics and thermal stability through a rapid thermal annealing.

2. Description of the Background Art

A core technology of a magnetic tunnel junction (MTJ) is a development technology of a thin film material assuming excellent and stable magnetic resistance characteristics and an integrated process technology using the conventional semiconductor circuit and process.

Tunneling magnetoresistance (TMR), that is receiving an active study, refers to a phenomenon that a tunneling current differs according to a relative magnetization direction of a ferromagnetic material in a junction with a structure of a ferromagnetic material/insulation material/ferromagnetic material structure.

The magnetic resistance thin film assuming the tunnel magnetic resistance, that is, a magnetic tunnel junction is spotlighted as a thin film device that is the most suitable for a nonvolatile magnetic random access memory (MRAM) device having excellent characteristics as well as a magnetic field sensor of a magnetic disk drive.

FIG. 1 is a sectional view of the magnetic tunnel junction, which includes: a substrate 11; a bottom lead 12; a seed layer 13; an anti-ferromagnetic layer 14; a first magnetic layer 15; a tunnel barrier layer 16; a second magnetic layer 17; and a top lead 18.

That is, the magnetic tunnel junction has a sandwich structure of the two first and second magnetic layers with the tunnel barrier 16 made as an insulation layer or an oxide layer (generally $Al_2O_3$) interposed there between.

Generally, the anti-ferromagnetic layer 14 is made of FeMn, IrMn or PtMn, or NiO.

In the device, a current flows vertically to the layers, unlike a CIP (current in plane) type giant magnetoresistance (GMR) that flows in parallel to each layer.

Accordingly, if spin directions in the magnetic layers 15 and 17 are the same (parallel to each other), resistance is low and a tunneling probability is high. If, however, the spin directions are the opposite (antiparallel to each other), resistance is high and a tunneling probability is small.

In other words, the current in the magnetic tunnel junction (referred to as a 'tunneling current', hereinafter) is dependent on the relative magnetization direction of the two magnetic layers 15 and 17.

Whether a corresponding bit is '0' or '1' can be discriminated by using the quality that the tunneling current differs (that is, a resistance value of the device differs) according to the direction of the spin. Thus, a bit can be written or read by applying a magnetic field to the magnetic tunnel junction.

The magnetic tunnel junction includes a pseudo spin-valve type in which the direction of spin can be controlled by using two magnetic layers with different coercive forces and an exchange bias type in which one of two magnetic layers is fixed through an exchange biasing field of the anti-ferromagnetic layer to thereby control a spin direction of a different magnetic layer.

In the MRAM operation, since, in most cases, one cell is selected by one of a bit line or a word line, the cells are repeatedly interfered. Thus, there is a high possibility that a magnetic creep phenomenon occurs so that a magnetization is made half or a magnetic switching is completely made.

In such a case, an error occurs in the memory device, so that it is necessary to strongly fix the magnetization by the anti-ferromagnetic layer. For this purpose, the anti-ferromagnetic layer 14 is made of a synthetic anti-ferromagnetic material (ferromagnetic layer/non-magnetic layer/ferromagnetic layer) to increase the effect of fixing the first magnetic layer 15.

In the development of the magnetic tunnel junction, one of the most important things is to increase TMR ratio because the TMR ratio is a critical factor having much influence on a density and a velocity of an MRAM device.

In addition, in the development of the magnetic tunnel junction, a magnetic switching and a thermal stability for a recording is very important.

In general, though the TMR ratio and the resistance (which is obtained by multiplying the resistivity by a junction face, R×A: R is the resistivity and A is an area of the junction face) of the magnet tunnel junction exhibit a comparatively favorable distribution in a wafer of 4~6 inches, a magnetic field where the magnetic switching of the magnetic tunnel junction occurs is considerably uneven.

It is observed that the uneven magnetic field is more increased as the size of the magnetic tunnel junction is reduced, and especially, when the size of below 1 $\mu m^2$.

The main reason for this is estimated to be a complicate magnetic switching behavior due to complicate magnetic domains and an unevenness of an infinitesimally patterned cell that is fabricated by an etching process.

In a conventional art, the magnetic tunnel junction is thermally treated for a long time while applying a magnetic field thereto, so as to improve the TMR ratio and the exchanging magnetic anisotropy: $H_{ex}$) of the magnetic tunnel junction and to increase the squareness of the free layer hysteresis loop.

SUMMARY OF THE INVENTION

Therefore, an object of the present invention is to improve a TMR ratio and an exchanging magnetic anisotropy ($H_{ex}$) of a magnetic tunnel function device only by a thermal treatment for a short time.

Another object of the present invention is to improve squareness in a magnetic switching of a free layer.

Still another object of the present invention is to improve a thermal stability of a magnetic tunnel junction.

To achieve these and other advantages and in accordance with the purpose of the present invention, as embodied and broadly described herein, there is provided a fabrication method of a magnetic tunnel junction including the steps of: forming a magnetic tunnel junction constructed having a first magnetic layer, a tunnel barrier formed at an upper surface of the first magnetic layer and a second magnetic layer formed at an upper surface of the tunnel barrier; and thermally treating the junction rapidly for 5 seconds ~10 minutes at a temperature of 200~600° C. to re-distribute atoms in the tunnel barrier and make the interface between the tunnel barrier and the magnetic layer to be even.

In the fabrication method of the magnetic tunnel junction of the present invention, the rapid thermal annealing can be made while applying a magnetic field, and preferably, it is performed radially by using an infrared lamp.

In the fabrication method of the magnetic tunnel junction of the present invention, after the rapid thermal annealing, cooling is performed for 10 seconds ~10 minutes, and in order to improve characteristics of a device, a thermal treatment can be additionally performed in the same manner as in the conventional thermal treatment, after the rapid thermal annealing.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Compared with the conventional art, the present invention accomplishes an economic effect by considerably reducing time taken for a thermal treatment and a cooling time, and improved electromagnetic characteristics and thermal stability.

A magnetic tunnel junction fabricated by the present invention can have an exchange bias type, in which a first magnetic layer is a pinned layer, a second magnetic layer is a free layer, and an anti-ferromagnetic layer, a pinning layer for pinning a spin direction of the first magnetic layer, is formed at the other side of the first magnetic layer. The first and the second magnetic layers can have a pseudo spin-valve type with different coercive forces to control the spin direction.

The rapid thermal annealing adopted in the present invention is the radial thermal treatment using the infrared lamp, for a quick heating and cooling.

Below Table 1 shows conventional thermal anneal (CTA) conditions and the rapid thermal anneal (RTA) conditions according to the preferred embodiment of the present invention.

TABLE 1

|  | CTA | RTA |
| --- | --- | --- |
| Lamp operation time | 15 minutes | 10 seconds |
| Thermal annealing time | One hour | 10 seconds |
| Cooling time | Within 1.5 hour | Within 1 minute and 30 seconds |
| Total treatment time | More than 2.5 hours | Within 2 minutes |
| Treatment temperature | 200~300° C. | 200~400° C. |

In the above embodiment, the RTA has the total treatment time of less than 2 minutes and electro-magnetically and thermally optimize the characteristics of the magnetic tunnel junction much faster than the CTA.

Figure 1:
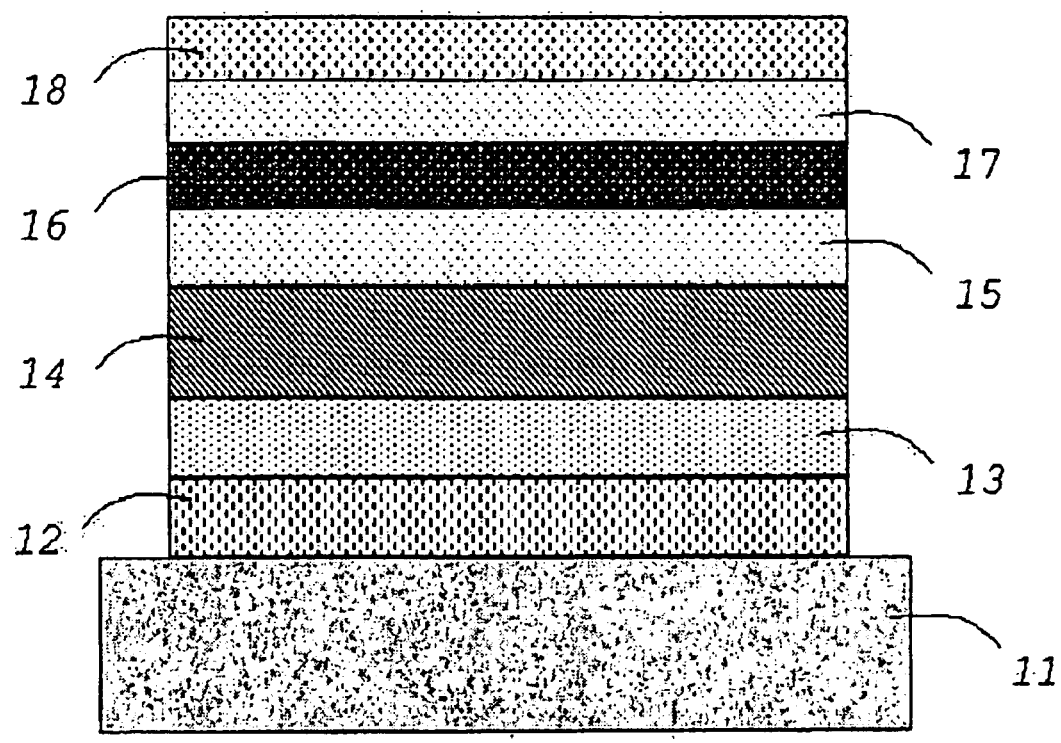
FIG. 1 is a sectional view of a magnetic tunnel junction (MTJ)
Figure 2:
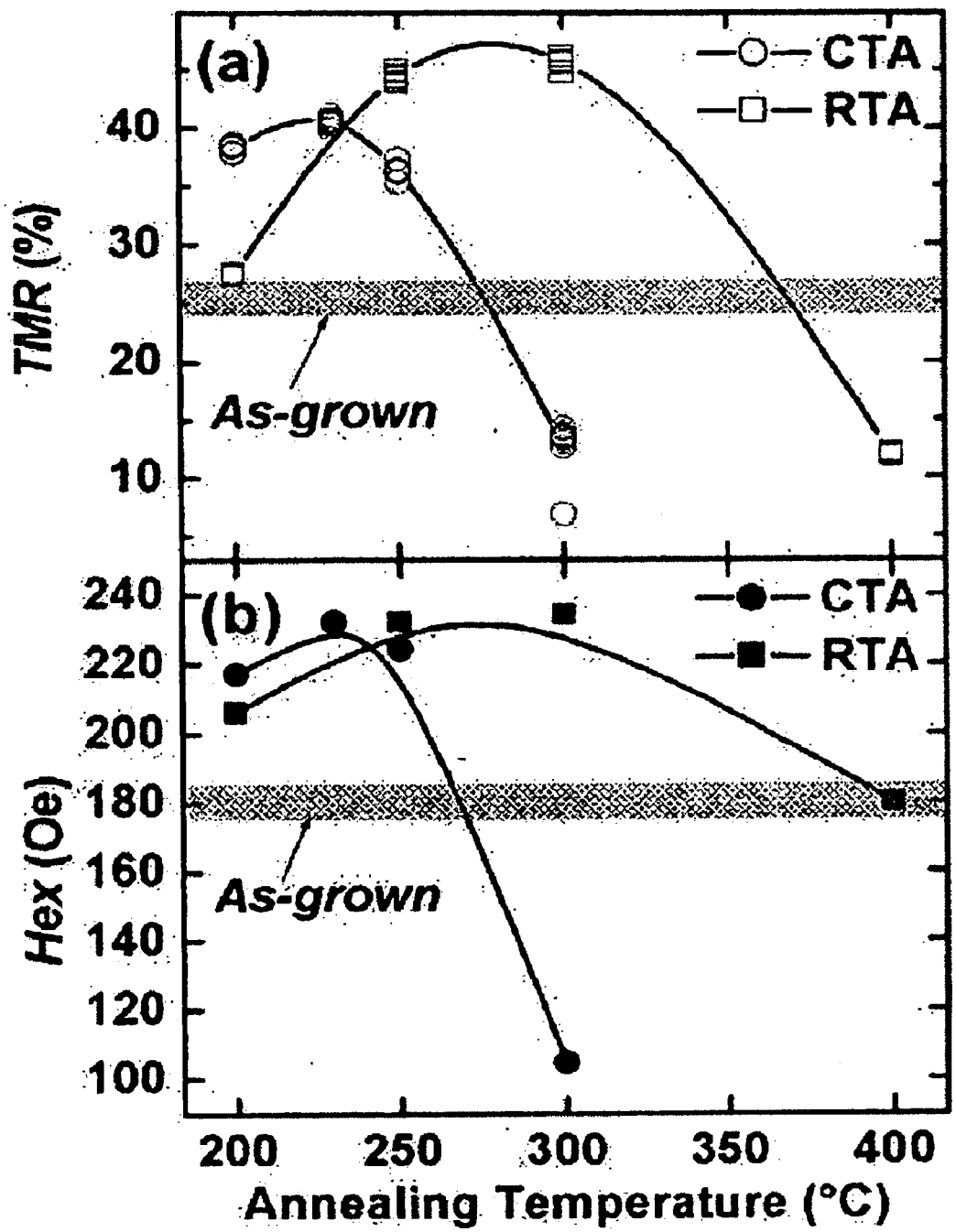
FIG. 2 is a graph showing TMR radio and a change of an exchanging magnetic anisotropy ($H_{ex}$) according to a thermal treatment temperature for a magnetic tunnel junction thermally treated by a CTA and an RTA.

FIG. 2 is a graph showing the variation of TMR ratio and exchange bias field ($H_{ex}$) against annealing temperature for a magnetic tunnel junction thermally treated by a CTA and an RTA.

When the thermal treatment is performed by the CTA, the TMR ratio is continuously increased up to 40% as the temperature goes up to 230° C. It is attributable to oxygen redistribution and homogenization in the Al oxide barrier during annealing process, giving rise to the improvement in the properties of MTJs.

However, the reduction of the TMR and $H_{ex}$ at elevated temperature for the RTA and CTA samples is attributable to interdiffusion of Mn at the interface of CoFe and FeMn or diffusion of Mn to the oxide barrier.

Meanwhile, when the thermal treatment is performed by the RTA, 46% of TMR ratio is obtained at a temperature of 250~400° C. Resistances of both cases are reduced to a few kΩ~some hundreds of Ω according to a temperature.

The exchange bias field (Hex) of the CTA is increased from 180 Oe to 230 Oe up to a temperature of 230° C. and then sharply decreased thereafter.

Meanwhile, in case of the RTA, the highest value of 230 Oe is shown at a temperature range of 250~400° C. and then very slowly decreased thereafter as the temperature is increased.

Figure 3A:
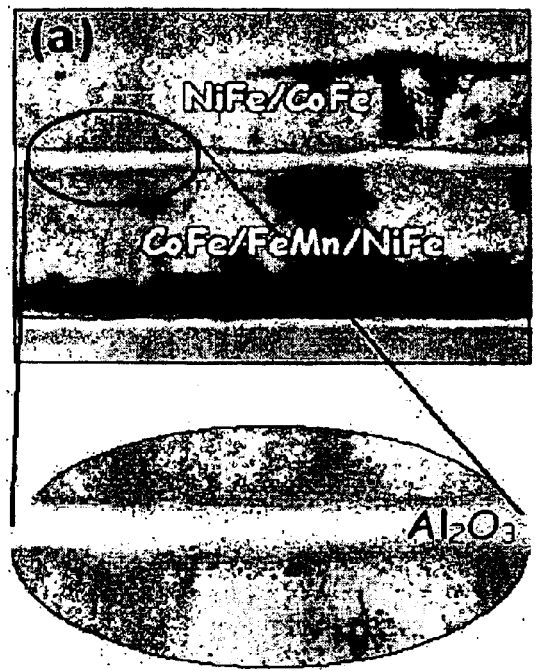
FIG. 3A is a sectional view showing a magnetic tunnel junction before applying a rapid thermal annealing method of the present invention.

FIG. 3A is a sectional view showing a magnetic tunnel junction before applying a rapid thermal annealing method of the present invention.

As shown in FIG. 3A, the Al oxide layer, the tunnel barrier of the magnetic tunnel junction before a thermal treatment, exhibits irregular interface with respect to the upper and lower magnetic layers and not clearly shown.

Figure 3B:
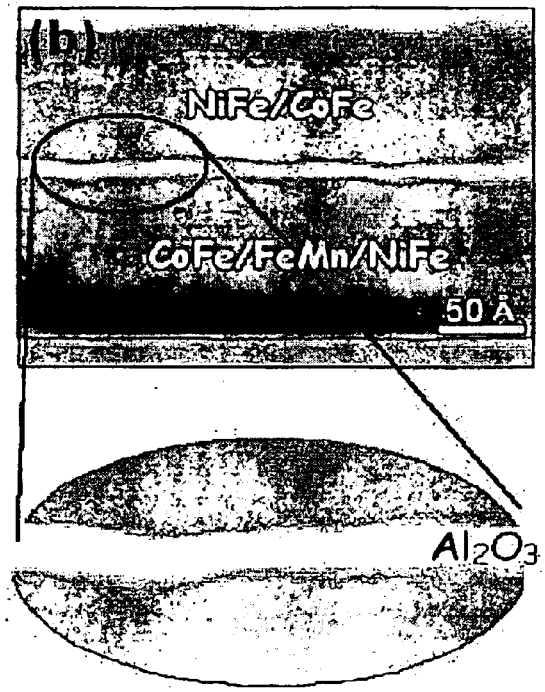
FIG. 3B is a section view of the magnetic tunnel junction after applying the rapid thermal annealing method of the present invention.

FIG. 3B is a section view of the magnetic tunnel junction after applying the rapid thermal annealing method of the present invention.

As shown in FIG. 3B, the interface of the oxide layer, the tunnel barrier, is comparatively clearly shown, which means that the re-distribution of the oxygen of the oxide layer and evenness were improved so that the interface of the oxide layer was clearly formed, and accordingly, its tunneling effect can be much improved.

Figure 4:
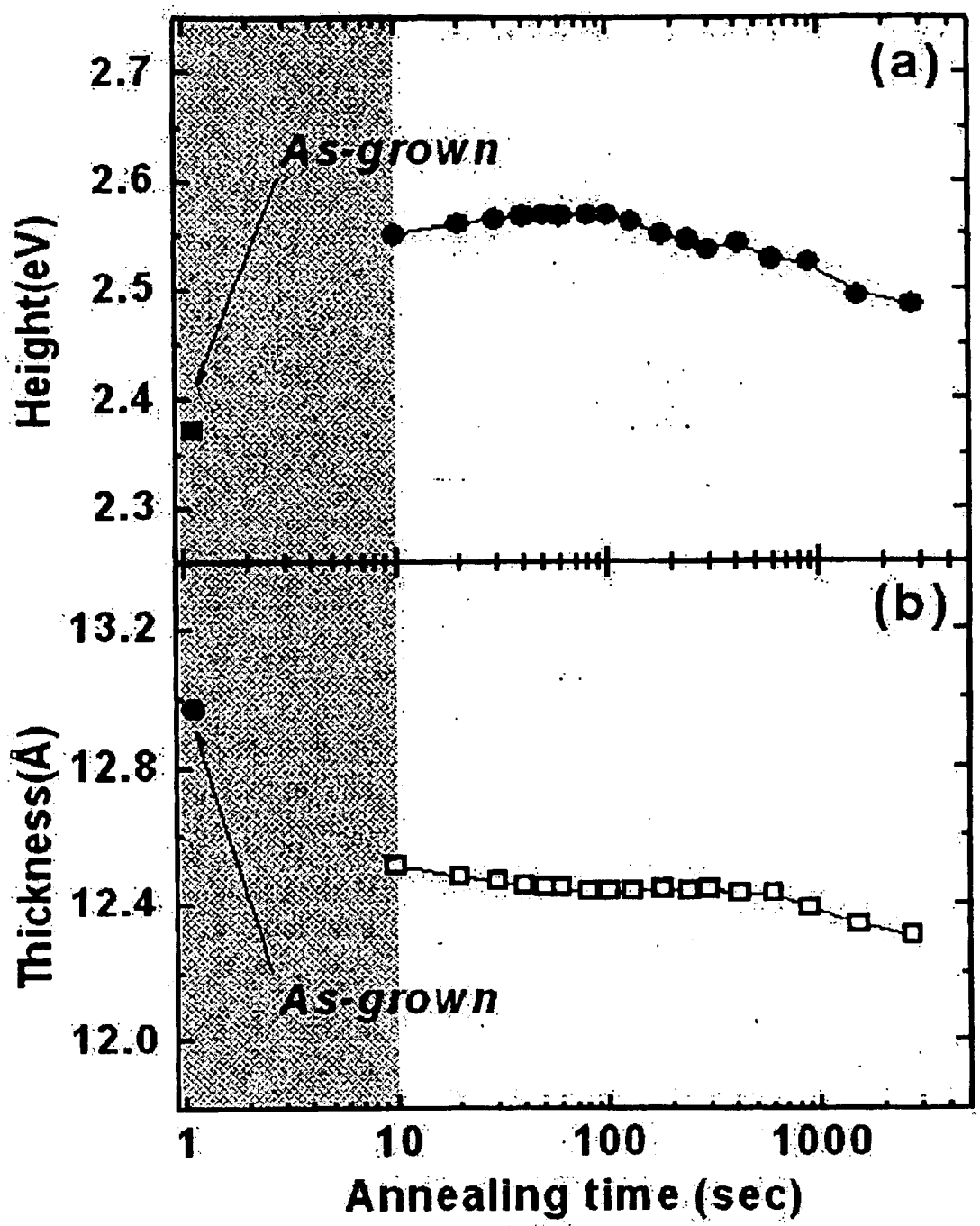
FIG. 4 is a graph showing the variation of the effective barrier thickness and height of a tunnel barrier in a magnetic tunnel junction after applying the rapid thermal annealing method of the present invention.

FIG. 4 is graph showing the variation of the effective barrier thickness and height of a tunnel barrier in a magnetic tunnel junction after applying the rapid thermal annealing method of the present invention.

The graph of FIG. 4 was obtained by analyzing a current-voltage curve from Simmons model at a temperature of 300° C.

As shown in FIG. 4, it is noted that the effective barrier thickness and the height of the oxide layer is rapidly changed within the initial 10 seconds of the RTA process. A change in the oxide layer after the initial 10 seconds is very slowly made according to the thermal treatment time.

Figure 5:
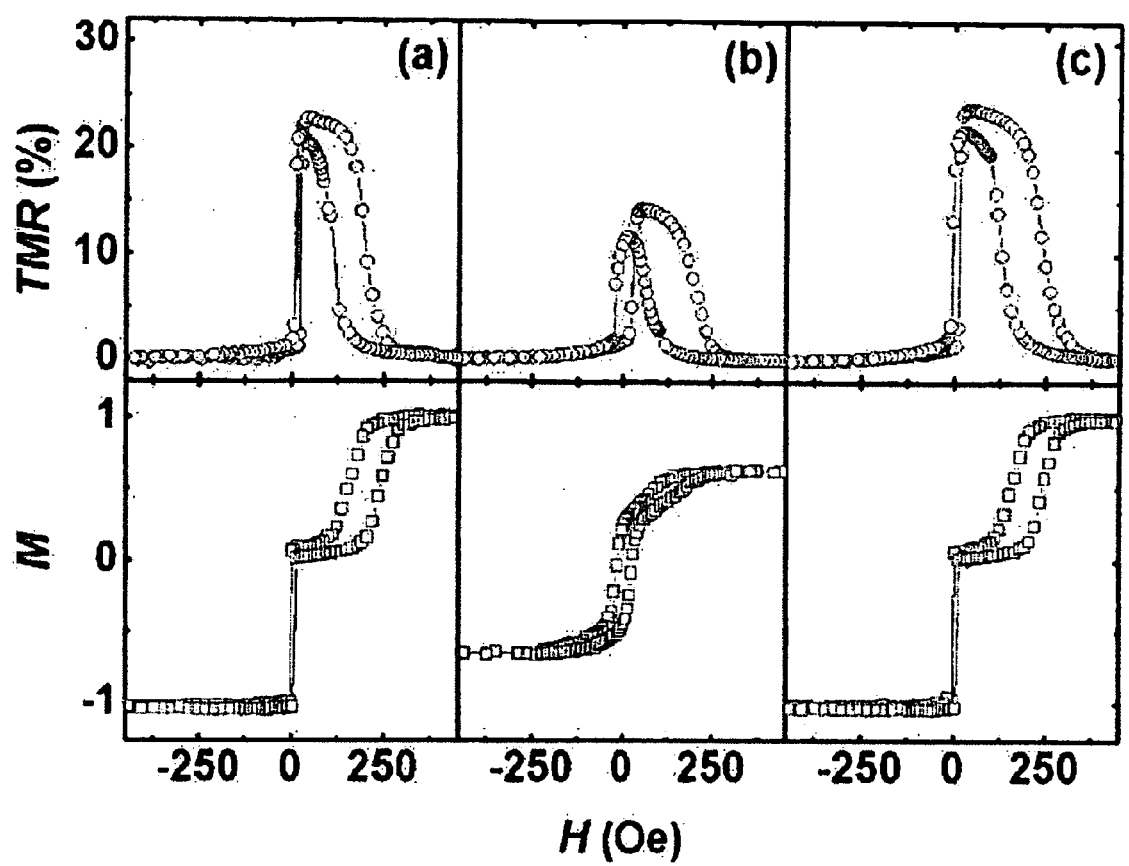
FIG. 5 is a graph showing the variation of TMR curves and M-H loops (M; magnetization, H; magnetic field) of a magnetic tunnel junction (a) before thermal treatment, a magnetic tunnel junction (b) thermally treated by the CTA at 300° C., and a magnetic tunnel junction (c) which was thermally treated with the RTA at 300° C. and then thermally treated again by the CTA at 300° C.

FIG. 5 is a graph showing the variation of TMR curves and M-H loops of a magnetic tunnel junction (a) before thermal treatment, a magnetic tunnel junction (b) thermally treated by the CTA at a temperature of 300° C., and a magnetic tunnel junction (c) which was thermally treated with the RTA at a temperature of 300° C. and then thermally treated again by the CTA at a temperature of 300° C.

As noted, FIG. 5C shows much improved TMR ratio and exchange bias field compared with FIG. 5B.

The magnetic tunnel junction (C) which has undergone the RTA and the CTA is similar to the magnetic moment of the magnetic tunnel junction (a) which has not been subjected to the thermal treatment.

That is, though the magnetic tunnel junction degraded by the CTA at the temperature of 300° C., it is not much degraded by the RTA even at the temperature of 300° C.

Figure 6A:
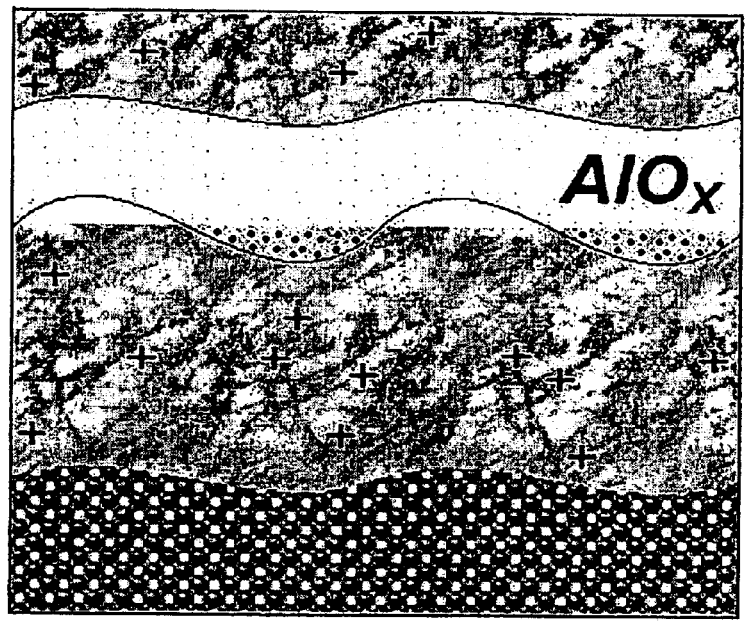
FIGS. 6A through 6C are schematic views showing a distribution of Mn of a magnetic tunnel junction (6A) before thermal treatment, a magnetic tunnel junction (6B) thermally treated by the CTA at 300° C., and a magnetic tunnel junction (6C) which was thermally treated with the RTA at 300° C. and then thermally treated again by the CTA at 300° C.
Figure 6B:
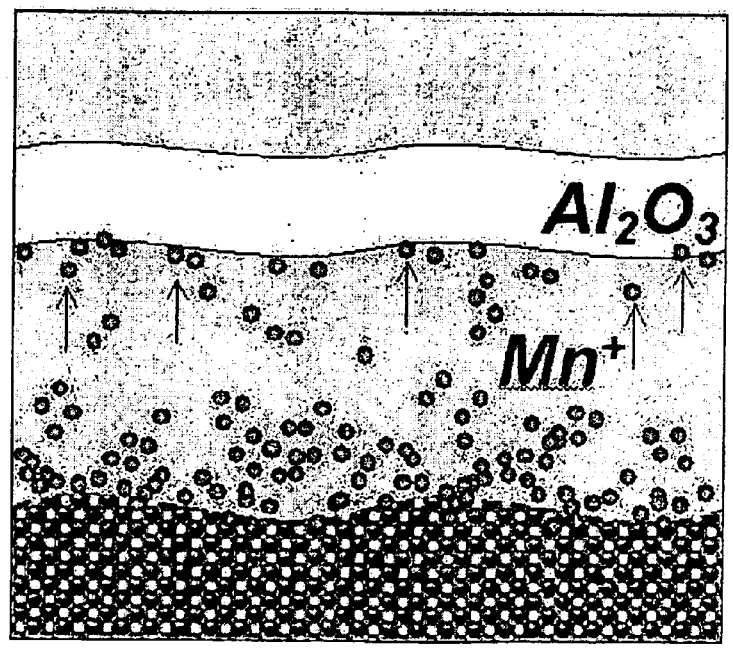
Figure 6C:
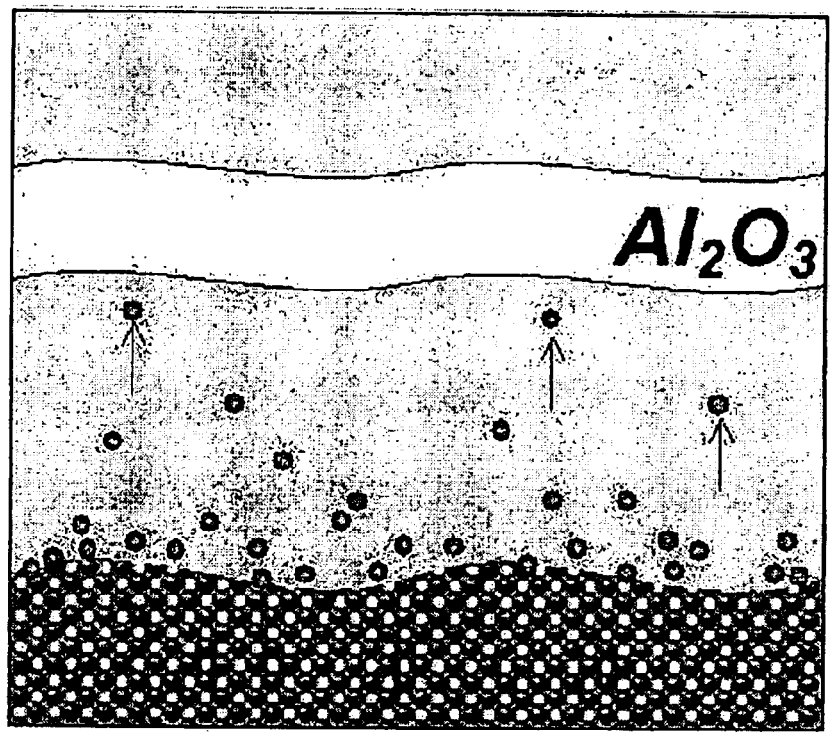

FIGS. 6A through 6C are schematic views showing a distribution of Mn ion of a magnetic tunnel junction (6A) before thermal treatment, a magnetic tunnel junction (6B) thermally treated by the CTA at 300° C., and a magnetic tunnel junction (6C) which was thermally treated with the RTA at 300° C. and then thermally treated again by the CTA at 300° C.

As shown in FIG. 6A, the improvement of the tunneling effect by the RTA owes to the fact that the oxygen is re-distributed and even by the RTA in the over-oxidized tunnel barrier ($AlO_x$).

Meanwhile, a similar effect can be obtained even by the CTA by performing at a proper temperature.

If, however, the temperature is high, as shown in FIG. 6B, Mn of the anti-ferromagnetic layer (FeMn) easily diffuses into the tunnel barrier through point defects or grain boundaries existing in the pinned layer to make a crucial influence on the tunneling magnetoresistance of the magnetic tunnel junction.

However, in case of the RTA, since the re-distribution of oxygen and evenness in the over-oxidized tunnel barrier occur for a short time (that is, about scores of seconds), and at the same time, the point defect, or the like, existing in the pinned layer serving as a diffusion path of Mn becomes extinct by the RTA, so that diffusion of Mn according to the following CTA can be prevented.

The improvement of the thermal stability of the RTA according to the diffusion preventing mechanism of Mn is as shown in FIG. 6C.

FIGS. 7A through 7D are graphs of Auger electron spectroscopy of a magnetic tunnel junction (7A) before thermal treatment, a magnetic tunnel junction (7B) thermally treated by the CTA at 300° C., a magnetic tunnel junction (7C) thermally treated with the RTA at 300° C., and a magnetic tunnel junction (7D) which was thermally treated with the RTA at 300° C. and then thermally treated again by the CTA at 300° C.

Figure 7A:
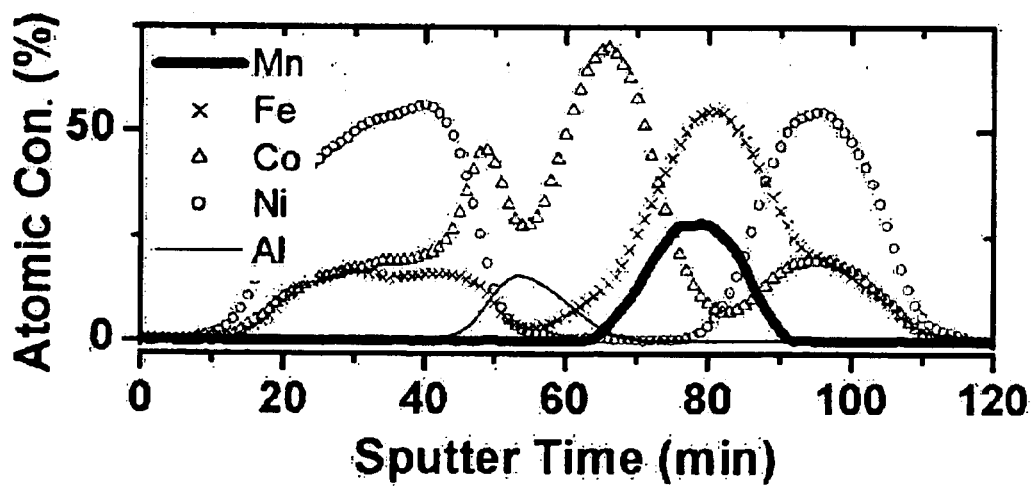
FIGS. 7A through 7D are graphs of Auger electron spectroscopy of a magnetic tunnel junction (7A) before thermal treatment, a magnetic tunnel junction (7B) thermally treated by the CTA at 300° C., a magnetic tunnel junction (7C) thermally treated with the RTA at a temperature of 300° C., and a magnetic tunnel junction (7D) which was thermally treated with the RTA at 300° C. and then thermally treated again by the CTA at 300° C.
Figure 7B:
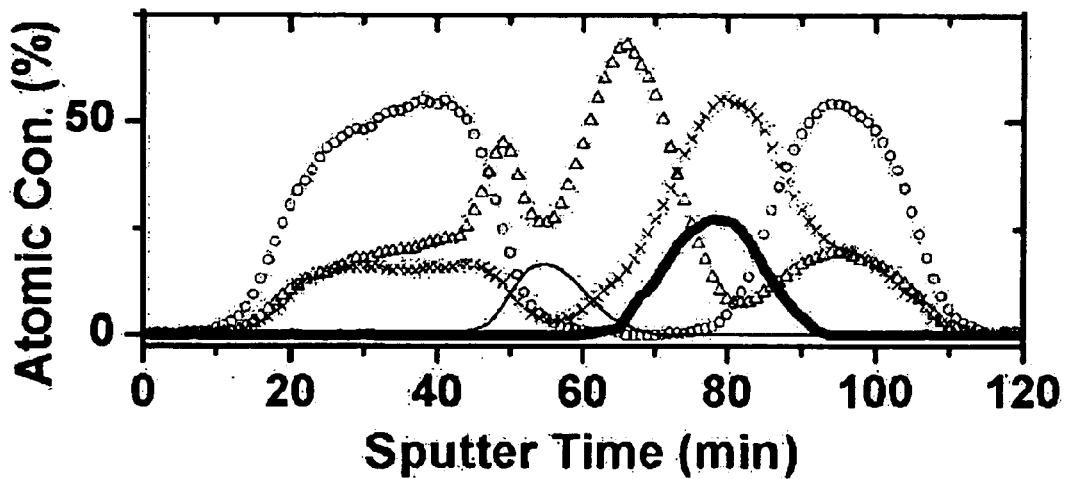
Figure 7C:
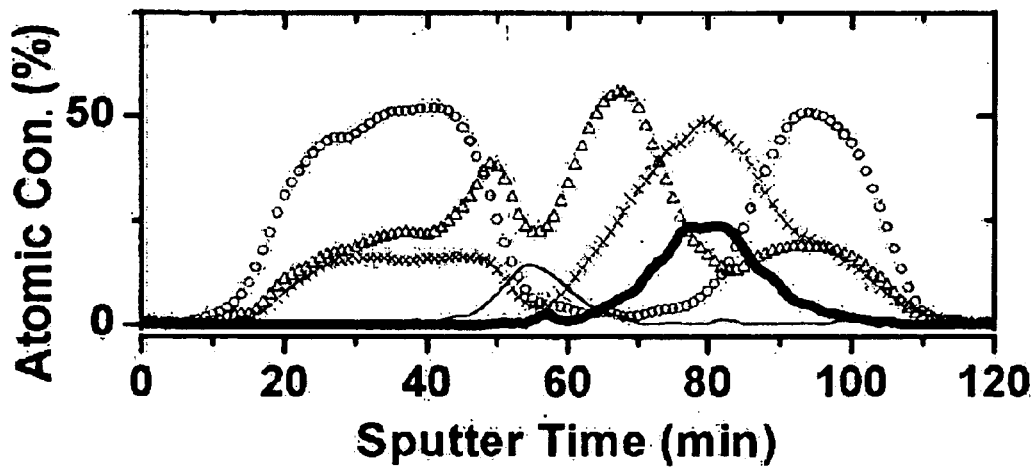
Figure 7D:
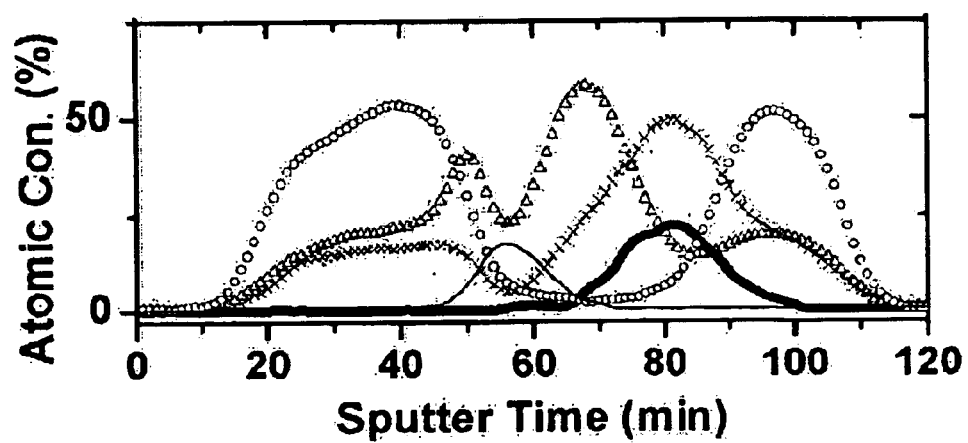

As an evidence establishing the explanations with reference to FIG. 6, when FIG. 7B and FIG. 7D are compared, diffusion of Mn is more remarkable when only the CTA is performed compared to the case that the RTA is performed and then the CTA is performed.

That is, the Auger electron spectroscopy analysis directly exhibits the thermal stability improvement by the RTA.

As so far described, the magnetic tunneling junction and its fabrication method of the present invention has many advantages.

That is, for example, first, the TMR ratio of the magnetic tunnel junction is considerably improved.

Secondly, the characteristics of the magnetic tunnel junction can be optimized more quickly and effectively compared to the conventional thermal treatment method.

Thirdly, the tunneling effect is improved by reducing the irregularity of the oxide layer, the tunnel barrier.

Fourthly, the effect of the thermal treatment affecting the oxide layer is made very quickly, so that the oxide layer can be optimized effectively.

Lastly, by adopting both the rapid thermal annealing method and the conventional thermal treatment method, the TMR ratio and the exchange bias field can be remarkably improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A fabrication method of a magnet tunnel junction comprising the steps of:

forming a magnetic tunnel junction constructed having a first magnetic layer, a tunnel barrier formed at an upper surface of the first magnetic layer and a second magnetic layer formed at an upper surface of the tunnel barrier; and thermally treating the junction rapidly for 5 seconds~10 minutes at a temperature of 200~600° C. to re-distribute atoms in the tunnel barrier and make the interface between the tunnel barrier and the magnetic layer to be even.

2. The method of claim 1, wherein the rapid thermal annealing is performed by applying a magnetic field.

3. The method of claim 1, wherein the rapid thermal annealing is radially performed by using an infrared lamp.

4. The method of claim 1, wherein, after the rapid thermal annealing, a cooling operation is performed for 10 seconds~10 minutes.

5. The method of claim 1, wherein the rapid thermal annealing is performed in a temperature range of 250~400°.

6. The method of claim 1, wherein, after the rapid thermal annealing, a thermal treatment is additionally performed.

7. The method of claim 1, wherein a first magnetic layer is a pinned layer, a second magnetic layer is a free layer, and an anti-ferromagnetic layer, a pinning layer for pinning a spin direction of the first magnetic layer, is formed at the other side of the first magnetic layer.

8. The method of claim 7, wherein the anti-ferromagnetic layer is made of one selected from the group consisting of FeMn, IrMn, PtMn or NiO.

9. The method of claim 8, wherein, in case of FeMn, thermal treatment is performed in a temperature range of 200~400° C., and in case of IrMn or PtMn, a thermal treatment is performed in the temperature range of 300~600° C.

10. The method of claim 7, wherein the anti-ferromagnetic layer is a synthetic anti-ferromagnetic material constructed by ferromagnetic layer/non-magnetic layer/ferromagnetic layer.

11. The method of claim 1, wherein the first magnetic layer and the second magnetic layer have different coercive forces to control the spin direction.

* * * * *